(12) United States Patent
Schrey et al.

(10) Patent No.: US 9,202,702 B2
(45) Date of Patent: Dec. 1, 2015

(54) SEMICONDUCTOR DEVICE HAVING AT LEAST ONE CONTACT, AND MANUFACTURING METHOD FOR A SEMICONDUCTOR DEVICE HAVING AT LEAST ONE CONTACT

(75) Inventors: Frederik Schrey, Leonberg (DE);
Achim Trautmann, Leonberg (DE);
Joachim Rudhard,
Leinfelden-Echterdingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 90 days.

(21) Appl. No.: 13/446,531

(22) Filed: Apr. 13, 2012

(65) Prior Publication Data
US 2012/0292641 A1 Nov. 22, 2012

(30) Foreign Application Priority Data

May 16, 2011 (DE) .......................... 10 2011 075 888

(51) Int. Cl.
| | |
|---|---|
| H01L 29/15 | (2006.01) |
| H01L 21/285 | (2006.01) |
| H01L 21/768 | (2006.01) |
| H01L 21/04 | (2006.01) |
| H01L 29/16 | (2006.01) |

(52) U.S. Cl.
CPC ...... H01L 21/28506 (2013.01); H01L 21/7688 (2013.01); *H01L 21/048* (2013.01); *H01L 29/1608* (2013.01)

(58) Field of Classification Search
USPC ........................................................ 438/670
See application file for complete search history.

(56) References Cited

U.S. PATENT DOCUMENTS

| | | | | |
|---|---|---|---|---|
| 5,091,288 | A * | 2/1992 | Zappella et al. ............... | 430/311 |
| 5,176,792 | A | 1/1993 | Fullowan et al. | |
| 5,270,252 | A | 12/1993 | Papanicolaou | |
| 5,360,697 | A * | 11/1994 | Mehra ........................... | 430/314 |
| 5,397,741 | A * | 3/1995 | O'Connor et al. ............ | 438/672 |
| 5,705,432 | A | 1/1998 | Lee et al. | |
| 2003/0153178 | A1* | 8/2003 | Maile ............................. | 438/670 |
| 2006/0292868 | A1* | 12/2006 | Yoshikawa .................... | 438/670 |

FOREIGN PATENT DOCUMENTS

| | | |
|---|---|---|
| DE | 69228044 | 8/1999 |
| JP | 59084550 | 5/1984 |
| JP | 2000058481 | 2/2000 |

OTHER PUBLICATIONS

IBM, "Electrical Measurement of Sputter Deposition Rate of Trenches," *IBM Technical Disclosure Bulletin*, vol. 35, No. 5, pp. 490-492, 1992.
Rossnagel, S. et al., "Collimated Magnetron Sputter Disposition," *Journal of Vacuum Science and Technology*, vol. 35, No. 2, pp. 261-265, 1991.

* cited by examiner

*Primary Examiner* — Mark Tornow
*Assistant Examiner* — Priya Rampersaud
(74) *Attorney, Agent, or Firm* — Kenyon & Kenyon LLP

(57) ABSTRACT

A semiconductor device having a substrate, and at least one contact, situated on and/or above a surface of the substrate, having at least one layer made of a conductive material, the conductive material including at least one metal. The layer made of the conductive material is sputtered on, and has tear-off marks on at least one outer side area between an outer base area facing the surface and an outer contact area facing away from the surface. A manufacturing method for a semiconductor device having at least one contact is also described.

10 Claims, 5 Drawing Sheets

SEMICONDUCTOR DEVICE HAVING AT LEAST ONE CONTACT, AND MANUFACTURING METHOD FOR A SEMICONDUCTOR DEVICE HAVING AT LEAST ONE CONTACT

CROSS REFERENCE

The present application claims the benefit under 35 U.S.C. §119 of German Patent Application No. DE 102011075888.7 filed on May 16, 2011, which is expressly incorporated herein by reference in its entirety.

FIELD OF THE INVENTION

The present invention relates to a semiconductor device having at least one contact. Moreover, the present invention relates to a manufacturing method for a semiconductor device having at least one contact.

BACKGROUND INFORMATION

A method for structuring tungsten layers is described in German Patent No. DE 692 28 044 T2. In the method, a mask made of titanium is formed. For this purpose, a titanium layer is deposited on a structured lacquer layer which partially covers a tungsten layer. In a subsequent lift-off process, the titanium deposited on the structured lacquer layer is washed off by removing the structured lacquer layer, using an acetone solvent spray mist. After etching the tungsten layer, using the mask made of titanium, the titanium mask may also be removed.

SUMMARY

The present invention provides a semiconductor device, and a manufacturing method for a semiconductor device having at least one contact.

The present invention allows a novel metal structuring. With the aid of the present invention, a conforming layer made of a conductive material which includes at least one metal is also advantageously structurable by using a lift-off process. With the aid of the lift-off process, it is thus possible to structure out not only a mask composed of a nonconforming layer, but also a functional layer, as at least a part of a contact, from a conforming layer made of a conductive material which includes at least one metal. At the same time, with the aid of the present invention, at least one layer of a contact is also producible from a conductive material which contains at least one metal which is diffusible into the substrate material, without the risk of undesirable diffusion of the metal into the substrate material.

The present invention in particular allows a lift-off process to be carried out without the disadvantages often associated with this process. Thus, the acceptability of the lift-off process for fabrication lines may be increased with the aid of the present invention. In particular, with the aid of the present invention, a direct structuring process (composed of a lithographic step and a subsequent wet chemical or plasma-based structuring step) may be replaced. Since undesirable diffusion of a metal of the structured layer, in particular in the case of a structured nickel layer, frequently occurs in this type of direct structuring process, this disadvantage may be avoided via the present invention.

Metal residues are reliably prevented when the present invention is implemented. Thus, the technology according to the present invention eliminates the shortcomings of a lift-off process having only one negative resist step, as well as of direct structuring using only one resist mask applied to the layer to be structured.

The present invention allows formation of a stable electrical contact with the aid of a double-layer lift-off. The yield and reliability of manufactured electrical contacts may be increased using this manufacturing method. The manufacturable components are also suited for high-temperature processes due to the prevention of diffusion of metal contaminants.

The present invention may be used in particular in silicon carbide (SiC) technology, but is not limited to same.

In one advantageous specific embodiment, the layer formed on the surface of the substrate is alloyed into a semiconductor material of the substrate. A more stable conductive contact across the layer is achievable in this way.

The layer may advantageously be made of nickel, a metal-nickel alloy, or an aluminum-cobalt alloy as the conductive material. With the aid of the technology according to the present invention, the layer is also producible from the named materials, which usually are not suitable for forming a layer as at least a part of a contact using a sputtering process and/or a lift-off process.

In particular, the outer base area and/or the outer contact area may be free of tear-off marks. These areas may thus be formed with a smooth outer surface.

The substrate may preferably include silicon carbide. It is thus possible to make use of the advantages of SiC technology for the semiconductor device.

In another advantageous specific embodiment, the at least one layer may have a first extension in a first spatial direction, oriented parallel to the surface, which is identical to a second extension along a second spatial direction, perpendicular to the first spatial direction, oriented parallel to the surface. This type of contact has a relatively large attack surface for a lift-off process step, and is therefore reliably producible in this way.

As an alternative or in addition to this specific embodiment, the at least one layer may have a design which is meander-shaped, zigzag-shaped, and/or offset in sections in a surface that is oriented parallel to the surface. In this case as well, the at least one outer side area has edges or steps which provide advantageous tear-off options.

The above-described advantages are also ensured for a corresponding manufacturing method for a semiconductor device.

In one advantageous specific embodiment of the method, the conforming layer made of the conductive material is sputtered on. Compared to a vapor-deposited metal layer, a metal layer formed with the aid of a sputtering process has a more conforming design. In other words, the sputtered-on metal layer achieves the characteristics of a conforming layer better than does a vapor-deposited metal layer. The contacts formed from a sputtered-on metal layer are considerably more stable and reliable than contacts structured from a vapor-deposited metal layer. With the aid of the technology according to the present invention, it is also ensured that even a lift-off layer that is covered by the sputtered-on layer may be reliably removed. Thus, due to the conforming design of a sputtered-on layer it is not necessary to dispense with a lift-off process. Likewise, it is not necessary to structure a vapor-deposited layer instead of a more advantageous sputtered-on layer to be able to satisfactorily carry out the lift-off process.

For example, the lift-off layer and/or mask may be formed from a photoresist. This allows simple removal of the lift-off layer and the mask with the aid of a lift-off process.

In addition, the at least one layer may be formed on the surface of the substrate and alloyed into a semiconductor material of the substrate with the aid of a heat treatment step. A good conductive contact over the at least one layer is achievable in this way.

The conforming layer may preferably be made of nickel, a metal-nickel alloy, or an aluminum-cobalt alloy as the conductive material. The method may thus also be carried out using conductive materials which are not usable in a conventional manufacturing method using a lift-off process.

In one advantageous specific embodiment, during the lift-off process, tear-off marks are formed on at least one outer side area between an outer base area facing the surface and an outer contact area facing away from the surface during removal of the lift-off layer by tearing away the residual area remaining after the etching process. The at least one layer may thus be easily implemented in a desired small size.

The at least one continuous recess in the lift-off layer may be formed by a first extension in a first spatial direction oriented parallel to the surface, which is identical to a second extension along a second spatial direction, perpendicular to the first spatial direction, oriented parallel to the surface. Alternatively or additionally, the at least one continuous recess in the lift-off layer may have a framing surface which is meander-shaped, zigzag-shaped, and/or offset in sections. It may thus be reliably ensured that the material introduced into the at least one recess has edges and/or steps for tear-off options.

BRIEF DESCRIPTION OF THE DRAWINGS

Further features and advantages of the present invention are explained below with reference to the figures.

DETAILED DESCRIPTION OF EXAMPLE EMBODIMENTS

FIGS. 1A through 1H show cross sections of a substrate for illustrating one specific embodiment of the manufacturing method.

The manufacturing method schematically represented with reference to FIGS. 1A through 1H may be carried out using a substrate 10 which includes a semiconductor material. Substrate 10 may in particular be made of the semiconductor material, for example silicon or silicon carbide. However, the practicability of the method is not limited to the use of this type of substrate 10.

Prior to carrying out the method, a (functional) layer substructure may be provided in substrate 10. One possible example of a (functional) layer substructure is a MOSFET in a substrate 10 made of silicon carbide. However, it is pointed out that the practicability of the method is not limited to a specific preparation/preprocessing of substrate 10.

Figure 1A:
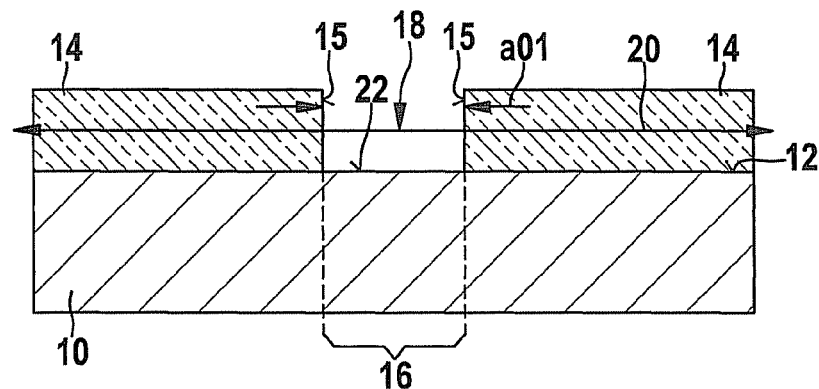
FIGS. 1A through 1H show cross sections of a substrate for illustrating one specific example embodiment of the manufacturing method.

An insulating layer 14 is optionally applied on and/or above a surface 12 of substrate 10. However, the method described below may also be carried out without forming insulating layer 14. Insulating layer 14 may be a silicon oxide layer, for example. However, another insulating material may also be used for forming insulating layer 14. Insulating layer 14 is preferably structured in such a way that at least one surface 22 is exposed, via a continuous recess 18 in insulating layer 14, at least one position 16 of the contact to be subsequently formed. The at least one position 16 may also be understood to mean a target area of the contact to be subsequently formed, i.e., a (subsequent) contact area of substrate 10. The design of the at least one continuous recess 18 may also be described in such a way that inner wall surfaces 15 which are oriented (practically) perpendicularly with respect to surface 12 are formed on insulating layer 14 which border the at least one surface 22 at the at least one position. FIG. 1A shows a cross section of the substrate after carrying out the above-described method steps.

In one advantageous specific embodiment, the at least one continuous recess 18 in insulating layer 14 is formed, having a first extension a01 in a first spatial direction 20 oriented parallel to surface 12, which is identical to a second extension (not illustrated) along a second spatial direction, perpendicular to first spatial direction 20, oriented parallel to surface 12 (not illustrated). Alternatively, the at least one continuous recess 18 in insulating layer 14 may be formed in such a way that it frames a surface 22 which is meander-shaped, zigzag-shaped, and/or offset in sections. In addition, some recesses 18 in insulating layer 14 may frame a surface 22 which is meander-shaped, zigzag-shaped, and/or offset in sections, while other continuous recesses have identical extensions along first spatial direction 20 and the second spatial direction which are oriented perpendicularly to one another. The advantages of this type of design of the at least one continuous recess 18 in insulating layer 14 are described in greater detail below.

A lift-off layer 24 is formed on and/or above surface 12 of substrate 10 in another method step, a continuous recess 26 in lift-off layer 24 being formed at the at least one position 16 of the at least one contact to be formed. The at least one continuous recess 26 opens up at least one surface 23 of a layer situated beneath lift-off layer 24 and/or surface 12 of substrate 10 at the at least one position. In other words, inner wall surfaces 25 which are oriented (practically) perpendicularly with respect to surface 12 are provided at structured lift-off layer 24 which frame the at least one surface 23 of the layer and/or surface 12 of substrate 10 situated beneath lift-off layer 24 at the at least one position.

Figure 1B:
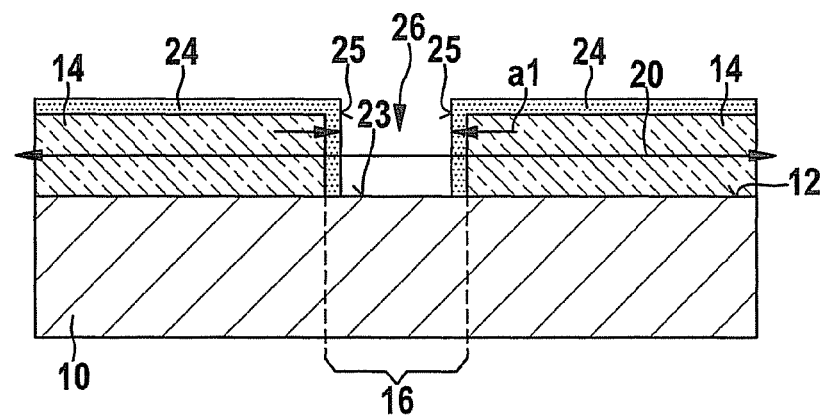

A photoresist layer is preferably formed as lift-off layer 24. The boundaries of the subsequently formed contact may be predefined with the aid of lift-off layer 24. FIG. 1B shows a cross section of substrate 10 after structured lift-off layer 24 is formed.

The at least one continuous recess 26 in lift-off layer 24 is preferably formed having a first extensional in first spatial direction 20, which is identical to a second extension (not illustrated) in second spatial direction 20 (not illustrated). Likewise, the at least one continuous recess 26 in lift-off layer 24 may open up a surface 23, which is meander-shaped, zigzag-shaped, and/or offset in sections, of the layer situated beneath lift-off layer 24 and/or surface 12 of substrate 10. Combinations of these advantageous recesses 26 are also advantageous, as explained in greater detail below.

Figure 1C:
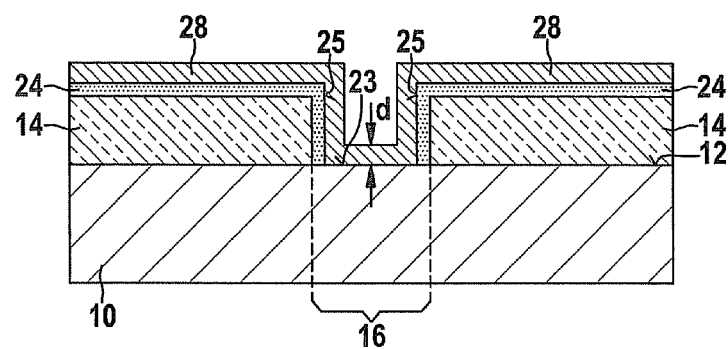

After structured lift-off layer 24 is formed, a conforming layer 28 made of a conductive material, including at least one metal, is formed. Conforming layer 28 completely covers the at least one position 16 of the at least one contact to be formed. In addition, conforming layer 28 at least partially covers first lift-off layer 24, as shown in FIG. 1C.

In particular, conforming layer 28 may be deposited over the entire surface, which may be easily carried out. Conforming layer 28 may be formed having a (preferably practically uniform) layer thickness d, which corresponds to a thickness of the at least one contact to be formed perpendicularly to surface 12 of substrate 10. (The layer of the contact is subsequently structured from the material which is deposited in the at least one position 16, i.e., which covers at least one surface 23 which is framed by inner wall surfaces 25.)

Conforming layer 28 made of the conductive material is preferably sputtered on. This ensures the desired conformity of conforming layer 28 for a contact which is formable from same. Conforming layer 28 may be made of nickel, a metal-nickel alloy, or an aluminum-cobalt alloy as the conductive material. Conforming layer 28 is preferably made of titanium-nickel. However, the designability of conforming layer 28 is not limited to the materials listed here.

During the application of conforming layer 28, lift-off layer 24 protects the areas covered by same from inadvertent direct contact with the material of conforming layer 28, in particular from inadvertent coating/covering by conforming layer 28. In addition, lift-off layer 24 ensures that the areas which it covers are reliably protected from diffusion of the at least one metal of conforming layer 28. In this way, insulation areas which are covered by lift-off layer 24 are also reliably protected from diffusion of the at least one metal of conforming layer 28, and thus, from contamination. In other words, lift-off layer 24 prevents the metal of conforming layer 28 from contacting areas outside the at least one position 16, i.e., the at least one desired contact area.

Figure 1D:
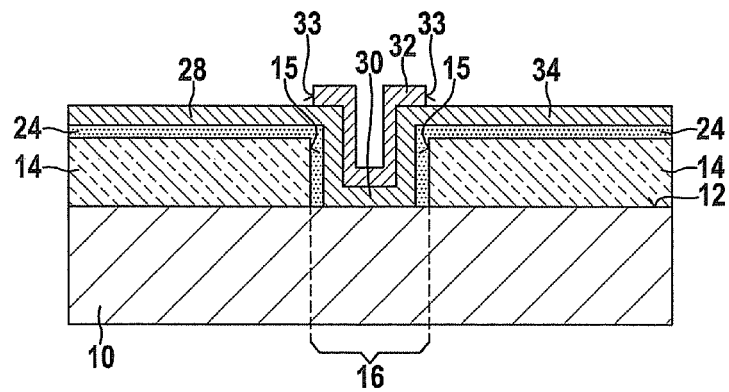
Figure 1E:
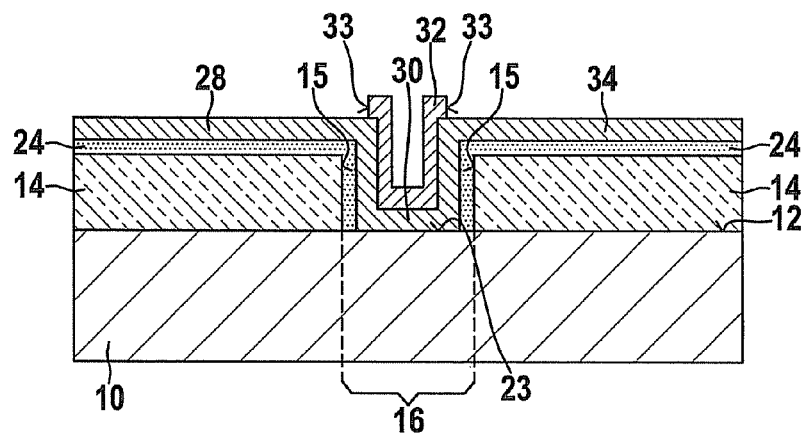

FIGS. 1D and 1E show cross sections of substrate 10 after at least one area 30 of conforming layer 28, which is situated in the at least one position 16/which covers at least one surface 23 framed by inner wall surfaces 25, has been covered by a mask 32. Mask 32 is formed with at least one continuous recess above a residual area 34 of conforming layer 28 situated externally from the at least one position. In particular, mask 32 may be formed in such a way that it has a clearance through residual area 34 as at least one continuous recess. In particular, the at least one continuous recess of mask 32 may subdivide the mask into separate subareas which are situated above the at least two positions 16/above the at least two surfaces 23. The subareas separated from each other preferably have a side edge 33 which is situated close to the edges of the associated position, i.e., close to inner wall surfaces 25. In other words, the structuring of mask 32 forms small "plaque-shaped" areas as mask 32. Mask 32 is preferably formed from a photoresist.

Mask 32 may be formed in such a way, for example, that the at least one side edge 33 is provided above the at least one inner wall surface 15 of insulating layer 14 (see FIG. 1D). To form this type of mask layout of mask 32, the same exposure mask may be used for structuring lift-off layer 24 and mask 32, lift-off layer 24 being formed from a "positive resist" and mask 32 being formed from a "negative resist." When a "negative resist" is used, the method may also be referred to as a negative resist process. Instead of a negative resist process, the same exposure mask may be exposed, using modified exposure parameters, for structuring lift-off layer 24 and mask 32.

Alternatively, mask 32 may be designed in such a way that the at least one side edge 33 is provided above the at least one inner wall surface 25 of lift-off layer 24 or above surface 23 framed by the at least one inner wall surface 25 (see FIG. 1E). For this purpose, an exposure mask which is different from the one used for structuring lift-off layer 24 is used for structuring mask 32. This allows a more specific design of mask 32 with respect to the predefinable requirements, as is apparent from FIG. 1E.

Figure 1F:
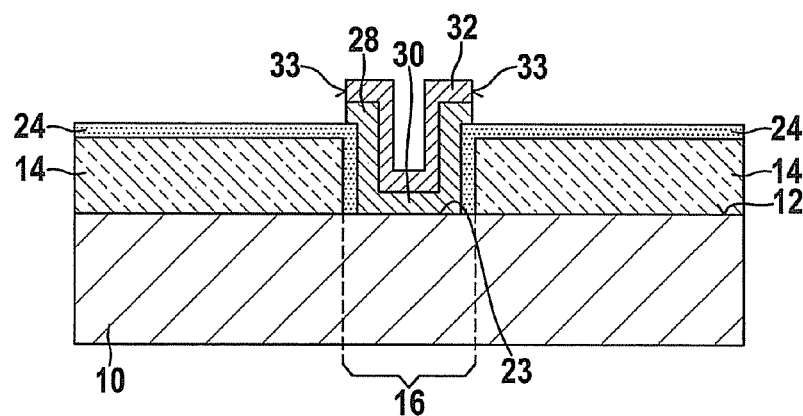

FIG. 1F shows a cross section of substrate 10 after carrying out an etching process using mask 32. During the etching process, residual area 34 of conforming layer 28 which is not covered by mask 32 is at least partially etched away. After the etching process, preferably only area 30 of conforming layer 28 protected by mask 32 remains at least partially in or above the at least one position 16. It is thus possible to obtain attack surfaces for carrying out a lift-off process despite the conforming design of conforming layer 28. In particular, a solution used for the lift-off process is able to penetrate into the area between the remainder of conforming layer 28 and lift-off layer 24, and thus detach lift-off layer 24 from the material which it covers.

The etching process may be a wet or dry chemical etching process, for example. The etching solution used for the etching process is selective with respect to the conductive material of conforming layer 28. In contrast, mask 32 and the lift-off layer are slightly etched by the etching solution or not at all. However, the practicability of the etching process is not limited to a specific etching material.

Lift-off layer 24 also protects the areas underneath it during the etching of conforming layer 28. If partial residues of conforming layer 28 remain on the surface of the etched areas, these partial residues are situated on the lift-off layer. Thus, during the etching process there is no risk of metal residues of conforming layer 28 diffusing into an area to be protected. In particular oxide areas, such as a gate oxide area in or on substrate 10, are protected by lift-off layer 24 and therefore remain free of metal residues. The formation of metal silicide in polysilicon, which typically occurs during etching due to contamination by metal residues, is likewise prevented by lift-off layer 24.

Figure 1G:
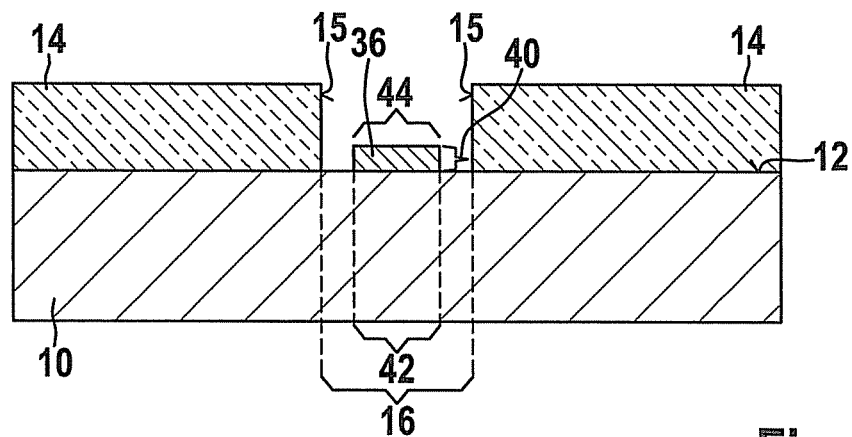

A lift-off process is carried out after the etching process. In the lift-off process, lift-off layer 24 is removed, and the at least one layer 36 (as at least part of the contact) in the at least one position 16 is structured from the residue of conforming layer 28 which remains after the etching process. The result is shown in FIG. 1G.

Acetone may be used, for example, to tear off lift-off layer 24. However, the practicability of the lift-off process described here is not limited to the use of acetone. This method step may be reliably carried out due to the previously described advantageous formation of attack surfaces for a solution used in the lift-off process. In particular, in the lift-off process the solution is able to penetrate into the intermediate area, situated close to surface 23, between the remainder of conforming layer 28 and lift-off layer 24, which achieves good removability of lift-off layer 24 from the material which it covers.

The lift-off process may be carried out in such a way that tear-off marks are formed on at least one outer side area 40 between an outer base area 42 facing surface 12 and an outer contact area 44 facing away from surface 12 by tearing away material from (the remaining residue of) conforming layer 28. The tear-off marks result when lift-off layer 24 is removed by tearing away the material of conforming layer 28 adhering to same.

Mask 32 and lift-off layer 24 are also lifted during the lift-off process. Thus, only the at least one layer 36 remains in the at least one position 16. A layer 36 of a contact/a contact made of metal is produced for a defined contact area by forming the at least one layer 36 in the at least one position 16. An ohmic contact, for example, is achieved with the aid of formed layer 36. However, it is pointed out that the usability of layer 36 is not limited to use as an ohmic contact. In particular, the at least one layer 36 may be easily formed in an advantageous small size with the aid of the above-described method steps.

Insulating layer 14 remains free of metal residues, even after lift-off layer 24 which previously covered it has been removed. Thus, there is no concern that a metal remaining on the insulating layer may diffuse into substrate 10 in a further method step. The risk of diffusion of metal residues into the substrate is negligible, in particular also during a subsequent heat treatment step, for example a rapid thermal annealing (RTA) process for thermal activation. This type of heat treatment step may thus be easily carried out after the lift-off process. A cleaning process may also optionally be carried out after the lift-off process.

Figure 1H:
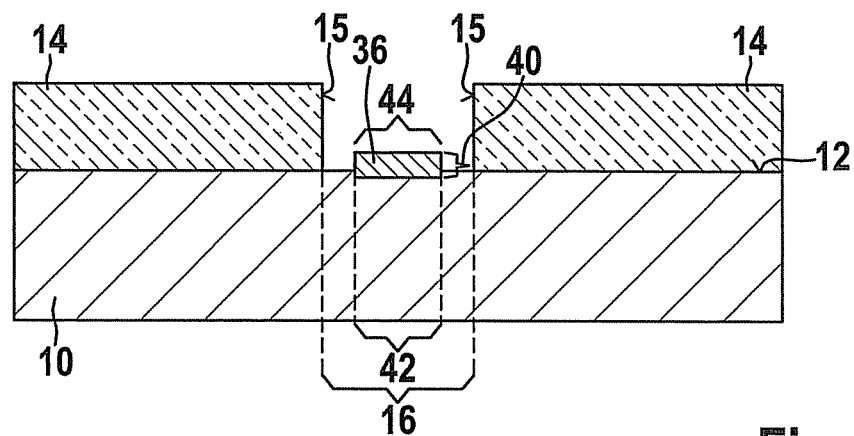

The at least one layer 36 situated on the surface of substrate 10 is preferably alloyed into a semiconductor material of substrate 10 with the aid of a heat treatment step. Examples of a suitable heat treatment step for this purpose are a rapid thermal annealing (RTA) process or a contact annealing step which may be carried out at a temperature above 1000° C., for example. Depending on the semiconductor material of substrate 10 and/or the conductive material of the at least one layer 36, a different temperature may also be set for carrying out the heat treatment step. The result of the heat treatment step is shown in FIG. 1H.

Layer 36 is preferably shaped and/or stabilized in the heat treatment step, which may also be referred to as a tempering process. Diffusion of metal outside the at least one position 16 is avoided due to the prevention of metal residues which has previously been carried out. Therefore, the heat treatment process is not limited with respect to temperature or time. The heat treatment process may typically have an overall process time of several minutes at temperatures around 1000° C. without concern for diffusion by metal.

It is pointed out once more that when the above-described method is carried out, semiconductor structures, for example a MOSFET design having a gate oxide situated on or in substrate 10, situated adjacent to the at least one position 16, are covered by lift-off layer 24 in particular during the application and etching of conforming layer 28. Thus, there is no concern that metal residues from conforming layer 28 will reach these structures. In particular, with the aid of the covering by lift-off layer 24, a gate oxide or a gate oxide covered with a polysilicon layer may also be protected in such a way that its continued reliability is ensured. In addition, metal residues, such as nickel residues in particular, may be prevented from diffusing into the structures and/or substrate 10 situated therebeneath. Furthermore, the formation of an undesirable metal silicide is prevented in this way.

Figure 2A:
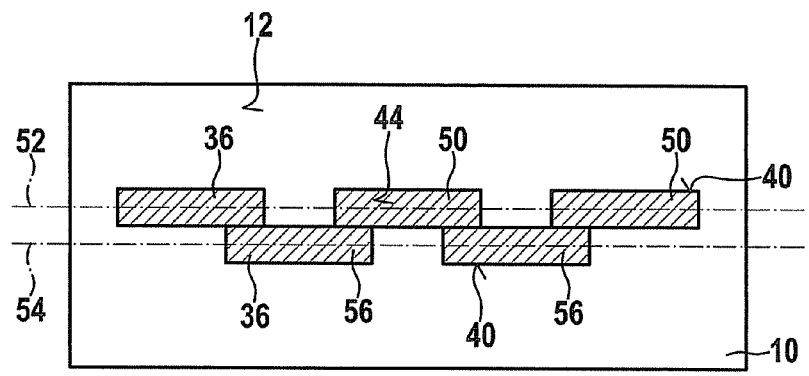
FIGS. 2A and 2B show schematic illustrations of two specific example embodiments of the semiconductor device.
Figure 2B:
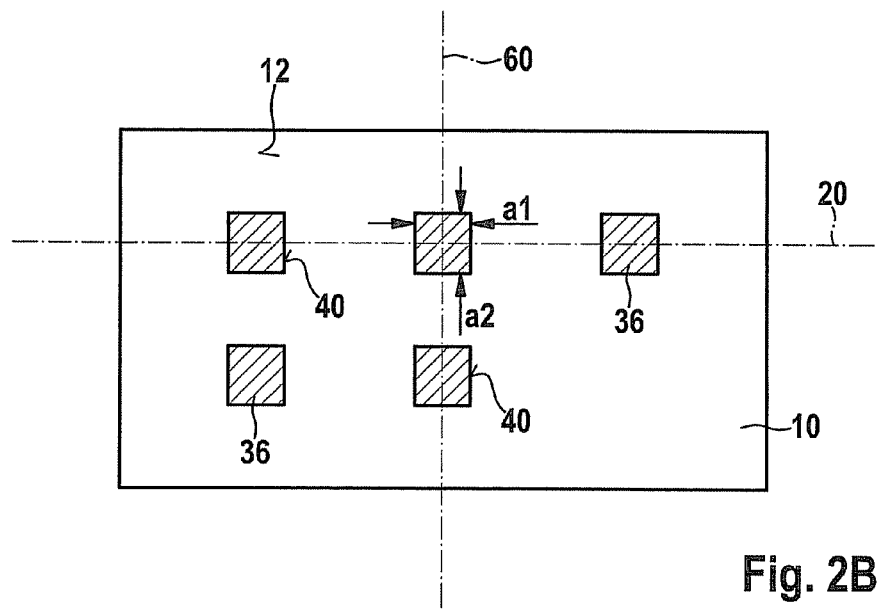

FIGS. 2A and 2B show schematic illustrations of two specific embodiments of the semiconductor device.

The semiconductor devices schematically represented in FIGS. 2A and 2B include a substrate 10 and at least one contact, situated on or above a surface 12 of substrate 10, having at least one layer 36 made of a conductive material. The conductive material includes at least one metal. For example, layer 36 may be made of nickel, a metal-nickel alloy, or an aluminum-cobalt alloy as the conductive material. Layer 36 is preferably made of titanium-nickel. In one refinement, the contact may have at least one further layer in addition to layer 36 described here.

Layer 36 made of the conductive material is sputtered on at or above surface 12. The type of metal deposition may be deduced by an analysis of the metal structure of layer 36. In addition, layer 36 has tear-off marks on at least one outer side area 40 between an outer base area 42 facing surface 12 and an outer contact area 44 facing away from surface 12. It is thus apparent that layer 36 is structured from a sputtered-on, conforming layer via a lift-off process. While the at least one outer side area 40 has tear-off marks, the outer base area and/or outer contact area 44 is/are preferably free of tear-off marks.

The at least one contact/the at least one layer 36 may be formed using the above-described manufacturing method. However, the producibility of the at least one contact/the at least one layer 36 of the semiconductor devices in FIGS. 2A and 2B is not limited to strict adherence to the above-described method.

Layer 36 formed on surface 12 of substrate 10 is preferably alloyed into a semiconductor material of the substrate. The semiconductor material of substrate 10 may be silicon carbide, for example.

The semiconductor device schematically represented in FIG. 2A has a layer 36 which is offset in sections in a surface oriented parallel to surface 12. The design of layer 36 may also be described in such a way that layer 36 is composed of first subareas 50 which extend along a first axis 52, and second subareas 56 which extend along a second axis 54 which is parallel to first axis 52. A gap is present between two adjacent first subareas 50. Similarly, a gap is also provided between two adjacent second subareas 56. The distance between first axis 52 and second axis 54 corresponds to the sum of the lateral distances of the mutually facing sides of subareas 50 and 56 from axes 52 and 54, respectively. The respective gap widths are set to be smaller than the extensions of subareas 50 and 56 in such a way that in each case an end of a first subarea 50 facing an adjacent first subarea 50 (laterally) contacts a second subarea 56, while in each case an end of a second subarea 56 facing an adjacent second subarea 56 (laterally) contacts a first subarea 50.

However, the practicability of layer 36 is not limited to a design that is offset in sections. For example, the at least one layer 36 in the surface oriented parallel to surface 12 may also be meander-shaped or zigzag-shaped.

Due to the advantageous design of layer 36, this layer has a large number of edges or steps in relation to its volume. In addition, layer 36 has a comparatively large overall surface area of the at least one outer side area 40 in relation to its volume. Layer 36 thus provides good tear-off options which allow the lift-off process to be reliably carried out.

The semiconductor device schematically represented in FIG. 2B has multiple layers 36, each having a first extensional in a first spatial direction 20 oriented parallel to surface 12, which is identical to a second extension a2 along a second spatial direction 60, perpendicular to first spatial direction 20, oriented parallel to surface 12. This ensures the advantages listed in the description of FIG. 2A.

The lift-off process may be simplified with the aid of the above-described examples of an advantageous design modification. Compared to line structures, structures having a square surface area, those that are meander-shaped, zigzag-shaped, or are offset in sections have improved suppression of metal residues at edges of the lift-off layer. Metal residues are not expected to be a problem for the two described design modifications.

What is claimed is:

1. A method for manufacturing a semiconductor device having at least one contact, the method comprising:

forming a lift-off layer on an insulating layer at least partially covering a surface of a substrate, a continuous recess in the lift-off layer and the insulating layer being provided at at least one position of at least one contact to be formed, the insulating layer having inner walls covered by the lift-off layer;

forming a conforming layer made of a conductive material including at least one metal, which completely covers the at least one position of the at least one contact to be formed and a portion of the lift-off layer covering the inner walls of the insulating layer;

covering at least one area of the conforming layer, situated in the at least one position, with a mask which is formed with at least one continuous recess above a residual area of the conforming layer situated externally from the at least one position;

carrying out an etching process, the residual area being at least partially etched away during the etching process; and carrying out a lift-off process, the lift-off layer being removed and at least one layer being structured out as at least part of the at least one contact in the at least one position, wherein tear-off marks are formed on at least one outer side area between an outer base area facing the surface and an outer contact area facing away from the surface during removal of the lift-off layer by tearing away the residual area remaining after the etching process;

wherein the method includes only one negative resist step.

2. The method as recited in claim 1, wherein the conforming layer made of the conductive material is sputtered on.

3. The method as recited in claim 1, wherein at least one of the lift-off layer and the mask are formed from a photoresist.

4. The method as recited in claim 1, wherein the at least one layer is formed on the surface of the substrate and is alloyed into a semiconductor material of the substrate with the aid of a heat treatment step.

5. The method as recited in claim 1, wherein the conforming layer is made of one of nickel, a metal-nickel alloy, or an aluminum-cobalt alloy, as the conductive material.

6. The method as recited in claim 1, wherein the at least one continuous recess in the lift-off layer is formed having a first extension in a first spatial direction oriented parallel to the surface, which is identical to a second extension along a second spatial direction, perpendicular to the first spatial direction, oriented parallel to the surface.

7. The method as recited in claim 1, wherein the at least one continuous recess in the lift-off layer has a framing surface which is at least one of meander-shaped, zigzag-shaped, and offset, in sections.

8. The method of claim 1, wherein the at least one area of the conforming layer is covered such that the mask does not directly contact least one of: the surface of the substrate, the lift-off layer, and the insulating layer in the cross-sectional view.

9. The method of claim 1, wherein the conforming layer is a continuous layer.

10. The method of claim 1, wherein the inner walls of the insulating layer directly contact the lift-off layer.

* * * * *